(12) United States Patent
Shih

(10) Patent No.: US 6,241,006 B1
(45) Date of Patent: Jun. 5, 2001

(54) HEAT SINK FOR CPU

(76) Inventor: John Wun-Chang Shih, No. 4, Alley 5, Lane 16, San-Min Rd., Shang-Shan Tsun, Chiung-Lin Hsiang, Hsinchu Hsien (TW)

(*) Notice: Subject to any disclaimer, the term of this patent is extended or adjusted under 35 U.S.C. 154(b) by 0 days.

(21) Appl. No.: 09/521,892

(22) Filed: Mar. 9, 2000

(51) Int. Cl.[7] ...................................................... H05K 7/20
(52) U.S. Cl. .......................................... 165/80.3; 361/704
(58) Field of Search ................................. 165/80.3, 185; 361/704, 710, 697; 257/722

(56) References Cited

U.S. PATENT DOCUMENTS

| | | | |
|---|---|---|---|
| 5,381,859 | * 1/1995 | Minakami et al. ................. | 165/80.3 |
| 5,494,098 | * 2/1996 | Morosas ............................. | 165/121 |
| 5,495,392 | * 2/1996 | Shen .................................. | 361/697 |
| 6,009,937 | * 1/2000 | Gonner et al. ..................... | 165/185 |
| 6,125,921 | * 3/1999 | Kuo .................................... | 165/80.3 |

* cited by examiner

Primary Examiner—Allen Flanigan
(74) Attorney, Agent, or Firm—Bacon & Thomas, PLLC

(57) ABSTRACT

A heat sink for CPU comprises a heat-conduction base and a plurality of heat dissipation fin sets, wherein the plurality of heat-dissipation fin sets made from webs are aligned; top edges of two lateral walls of the heat-conduction base are higher than that of the fin sets to form a fan-installation space, and a plurality of snap-joint openings are formed in those two lateral walls for joining a cooling fan; and, the fin sets are upright and closely joined face-to-face on the heat-conduction base by welding.

4 Claims, 3 Drawing Sheets

HEAT SINK FOR CPU

BACKGROUND OF THE INVENTION

This invention relates generally to a heat sink for a CPU (Central Processing Unit), and particularly to a heat sink that has a large heat dissipation area with excellent dissipation efficiency.

Subsequent to the fast development of the personal computer (PC), the related elements, such as hard disk drive (HDD), interface cards, and CPUs, have to deal with data more massively and more rapidly. This causes the temperature of the related elements are to soar internal quickly and heat sinks are required to lower down the temperature (particularly the chips) to maintain longevity of the elements.

An average heat sink is usually composed of a cooling fan and a plurality of heat-dissipation fin sets, wherein the cooling fan is used to blow air to dissipate heat through convection and radiation, and the heat dissipation efficiency is proportional to the area of the heat-dissipation fin sets.

From this point of view, the area of the plurality of heat-dissipation fin sets made of aluminum having an extruded or cast profile is more or less insufficient, wherein neither the dissipation fin sets of aluminum extrusion formed in a considerable thickness and intervals with a limited dissipation area, a larger wind resistance, and a slow airflow speed because of extrusion conditions, nor the aluminum cast dissipation fin sets with an insufficient dissipation area can dissipate heat efficiently despite a relatively smaller wind resistance.

A conventional heat sink shown in FIG. 1 reveals that the heat sink A mainly contains a contact base A1, whereon a plurality of fin sets A2 is are disposed, and a convection channel A3 is provided between every two neighboring fin sets A2.

After being used for a long-term period, the conventional heat sink A has been found inefficient for the reason of insufficient dissipation area despite an additional fan being installed.

SUMMARY OF THE INVENTION

The primary object of this invention is to eliminate the abovesaid defect by using a welding technique to form a close contact between a plurality of heat-dissipation fin sets and a heat-conduction base so that the fin sets can contact the heat-conduction base face-to-face in order to obtain a better heat conduction effect.

Another object of this invention is to weld a plurality of upright fin sets on a heat-conduction base, wherein a height difference exists between the top edge of the plurality of fin sets and that of two lateral walls of the heat-conduction base to form a fan-installation space; and, a plurality of snap-joint openings are formed in the lateral walls of the heat-conduction base for stably fixing a cooling fan.

For more detailed information regarding this invention together with further advantages or features thereof, at least an example of preferred embodiment will be elucidated below with reference to the annexed drawings.

BRIEF DESCRIPTION OF THE DRAWINGS

The related drawings in connection with the detailed description of this invention to be made later are described briefly as follows in which.

DETAILED DESCRIPTION OF THE PREFERRED EMBODIMENT

Figure 1:
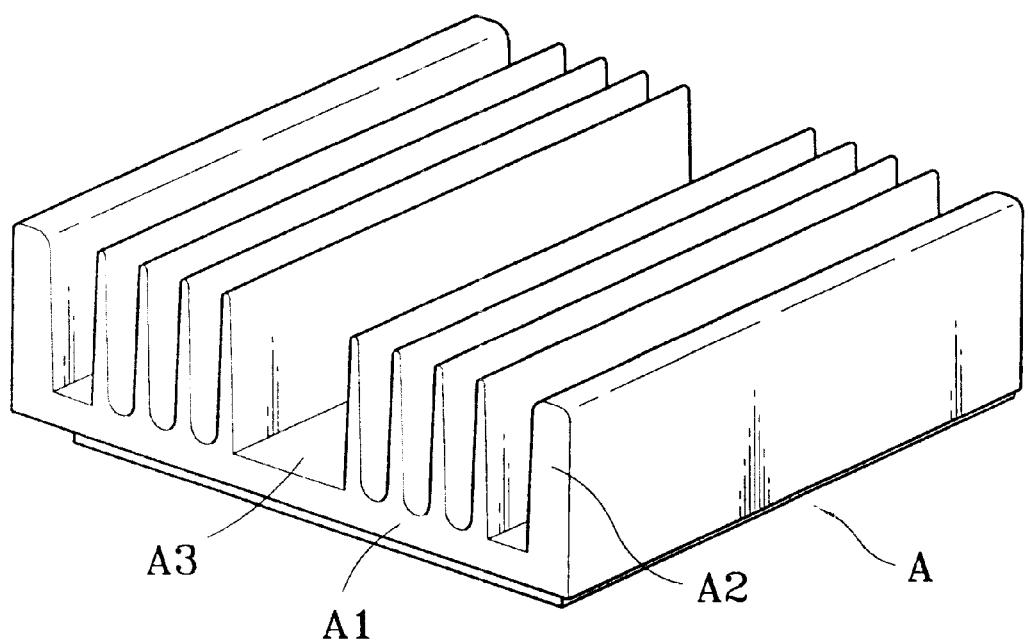
FIG. 1 is a perspective view of a conventional heat sink.
Figure 2:
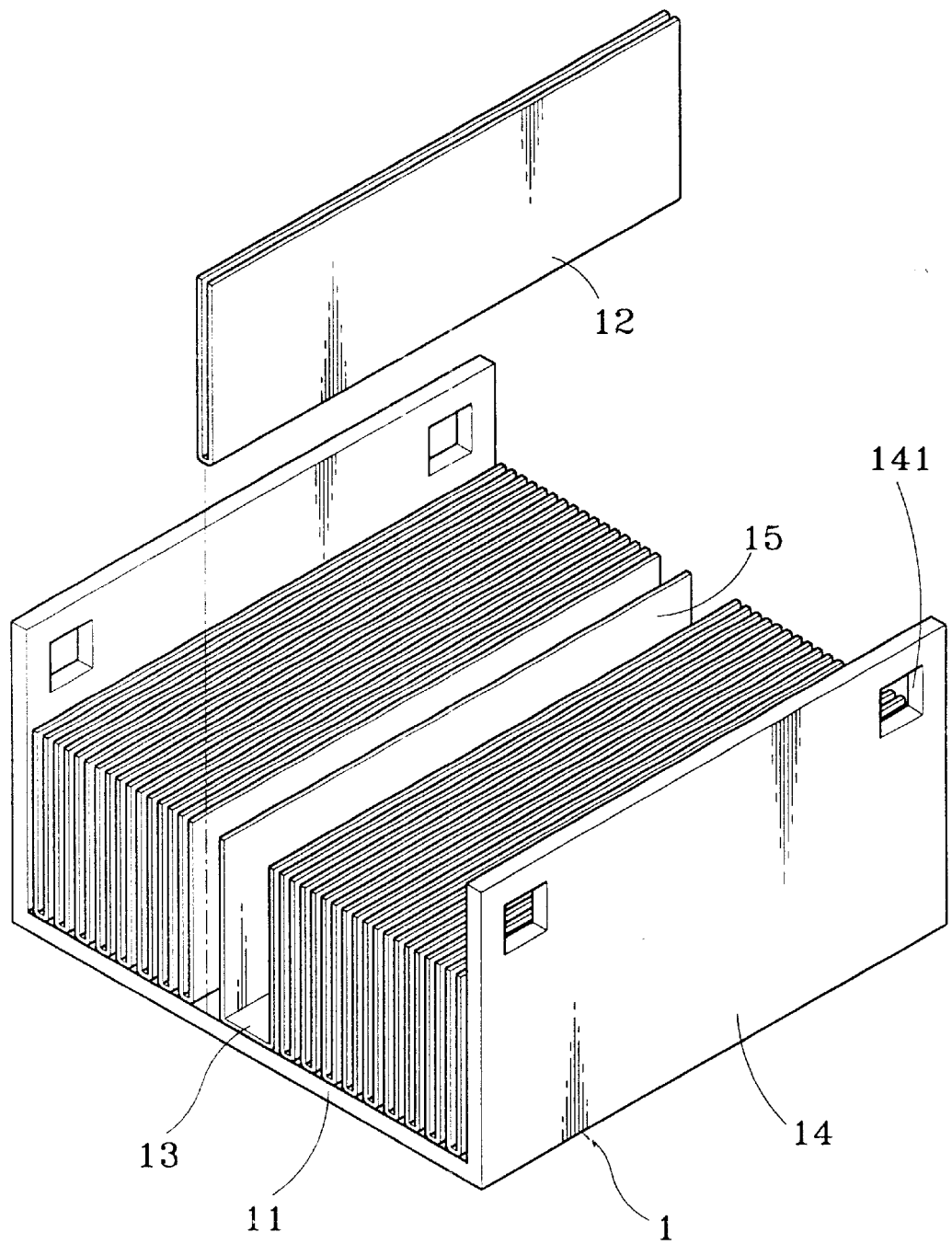
FIG. 2 is a perspective view of a heat sink of this invention.

As shown in FIG. 2, the present heat sink 1 comprises a plurality of heat-dissipation fin sets 12 and a heat-conduction base 11 whereon the fin sets 12 are welded. Fin sets 12 may be made from a material with excellent thermal conductivity, such as aluminum, cooper or the like. A plurality of predetermined snap-joint openings 141 are formed in two lateral walls 14 of the heat-conduction base 11, wherein the height of those two lateral walls is higher than that of the fin sets 12 to form a fan-installation space. A convection channel 13 is formed between every two adjacent fin sets 12. Each fin set 12 is formed as a flat web that is folded into a U-shape. The heat-conduction base is made of a material having high thermal conductivity such as aluminum, cooper or the like. The fin sets 12 are welded on the heat-conduction base 11 to extend upwardly by a special welding technique, which can be but not limited to conventional TIG or MIG welding. A low cost laser welding process with better precision, lower heat pressure, and lower deformation can also be applied to thoroughly each fin set 12 to the heat-conduction base 11 for obtaining the best heat conduction effect.

Figure 3:
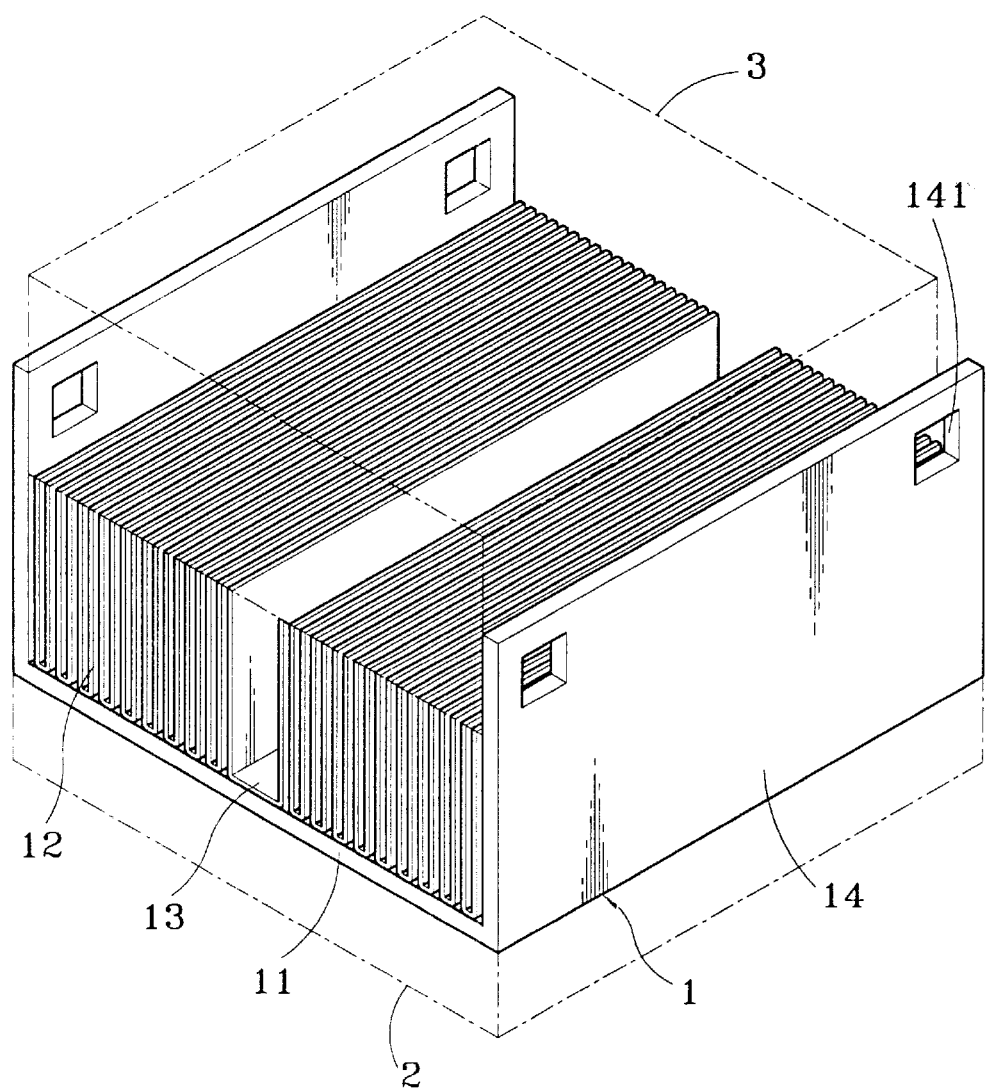
FIG. 3 is a perspective view showing the application of this invention.

Referring to FIG. 3, the heat sink 1 of this invention is fixedly disposed on a CPU 2, and a cooling fan 3 can be installed in the fan-installation space 15 and retained at the snap-joint openings 141.

By doing this way, the thickness of a heat dissipation fin and fin interval can be substantially reduced to thus increase the fin count and enlarge the heat-dissipation area. Moreover, a cooling fan attached to a heat sink rapidly expel high-temperature air created by a CPU.

From the above, it may be summarized that this invention provides an improved heat sink for CPU, wherein a plurality of heat-dissipation fin sets made from webs are aligned continuously. The top edges of two lateral walls of a heat-conduction base are higher than those of the fin sets to form a fan-installation space, and a plurality of snap-joint openings are formed in the two lateral walls for fixedly joining a cooling fan. The sets are upright and closely joined face-to-face on the heat-conduction base by using a welding technique, thus eliminating the conventional defects and obtaining a high efficiency heat dissipation effect.

Although, this invention has been described in terms of preferred embodiments, it is apparent that numerous variations and modifications may be made without departing from the true spirit and scope thereof, as set forth in the following claims.

What is claimed is:

1. A heat sink for a CPU, the heat sink comprising:
   (a) heat-conductive base having a pair of spaced walls extending upwardly therefrom;
   (b) a plurality of heat-dissipation fin sets welded on the base between the walls and extending upwardly from the base, the walls and fin sets terminating in top edges, the top edges of the walls being higher than the top edges of the fin sets for defining an installation space between the walls to receive a cooling fan; and
   (c) the walls further including a plurality of snap-joint openings formed therein for retaining the cooling fan in the installation space.

2. The heat sink of claim 1 wherein the fin sets and the walls are made of a thermal conductive material.

3. The heat sink of claim 2 wherein the heat conductive material is selected from the group consisting of copper and aluminum.

4. The heat sink of claim 1 wherein each fin set is formed from a flat web folded into a substantially U-shaped configuration.

* * * * *